United States Patent [19]

Han

[11] Patent Number: 5,512,509
[45] Date of Patent: Apr. 30, 1996

[54] METHOD FOR FORMING AN ISOLATION LAYER IN A SEMICONDUCTOR DEVICE

[75] Inventor: Chung Soo Han, Kyungki-do, Rep. of Korea

[73] Assignee: Hyundai Electronics Industries Co., Ltd., Kyungki-do, Rep. of Korea

[21] Appl. No.: 346,929

[22] Filed: Nov. 23, 1994

[30] Foreign Application Priority Data

Nov. 23, 1993 [KR] Rep. of Korea .................. 93-24975

[51] Int. Cl.⁶ .................................................. H01L 21/76
[52] U.S. Cl. ...................................... 437/70; 437/72
[58] Field of Search ............... 437/72, 70; 148/DIG. 85, 148/DIG. 86, DIG. 117

[56] References Cited

U.S. PATENT DOCUMENTS 5,175,122  12/1992  Wang et al. .

FOREIGN PATENT DOCUMENTS 59-92547   5/1984   Japan .
62-14439   1/1987   Japan .
63-258040  10/1988  Japan .

*Primary Examiner*—George Fourson
*Attorney, Agent, or Firm*—Pennie & Edmonds

[57] ABSTRACT

A present method for forming an isolation layer in a semiconductor can minimize the size of a "bird's beak" and reduce the stress on a silicon substrate by forming a trench in the filed region, a nitride spacer on the inner wall of the trench, and a polysilicon spacer on the nitride spacer that is formed on the inner wall of the trench.

10 Claims, 3 Drawing Sheets

METHOD FOR FORMING AN ISOLATION LAYER IN A SEMICONDUCTOR DEVICE

FIELD OF THE INVENTION

The present invention relates to a method for forming an isolation layer in a semiconductor device, and more particularly, to a method for forming an isolation layer in a semiconductor device that can minimize the size of a "bird's beak" and reduce the stress on a silicon substrate by forming a trench in the filed region, a nitride spacer on the inner wall of the trench, and a polysilicon spacer on the nitride spacer that is formed on the inner wall of the trench.

In general, as semiconductor device integration has increased, techniques for reducing the unit cell size in the semiconductor device, which is an important element in miniaturization, have been actively sought. However, conventional techniques for reducing unit cell size have their limitations. In particular, when an isolation layer for separating unit cells is grown, so-called "bird's beak" portions are formed causing field regions to extend into the active region, and thereby expanding the dimensions of the field region.

FIGS. 1A to 1C illustrate the sequential fabrication process for forming an isolation layer in a semiconductor device by using the conventional method.

Referring to FIG. 1A, a pad oxide film 2 is grown on a silicon substrate 1. A nitride film 3 is deposited on the pad oxide film 2. To define a field region, portions of the nitride film 3 and pad oxide film 2 are sequentially etched by means of separate mask and etching processes. Next, an exposed part of the silicon substrate 1 is etched by an anisotropic silicon etch, thereby forming a trench 4 in the silicon substrate 1. A sacrifice oxide film 5 is grown on the silicon substrate 1 that is exposed at the interior of the trench 4. A nitride spacer 6 is formed on the inner wall of the trench 4 which is constituted by nitride film 3 and sacrifice oxide 5.

Referring to FIG. 1B, an isolation layer 8 is formed by an oxidation process.

Referring to FIG. 1C, the nitride spacer 6, the nitride film 3 and the pad oxide film 2 are sequentially removed by means of a wet-etching process.

However, in the conventional isolation method, when the isolation layer is grown, an edge of the isolation layer becomes indented by the nitride spacer. Therefore, an electrical field is increased at the edge. Further, in the trench structures, the silicon substrate becomes directly oxidized by the field oxidation process, thereby generating a stress at a corner of the trench.

SUMMARY OF THE INVENTION

Accordingly, in order to solve the above-mentioned problem present in the conventional reduction technique, a purpose of the present invention is to provide a method for forming an isolation layer in a semiconductor device that can minimize the size of a bird's beak and reduce the stress on the silicon substrate by means of forming a trench in the field region, a nitride spacer on the inner wall of the trench, and a polysilicon spacer on the nitride spacer that is formed on the inner wall of the trench.

According to the present invention, a pad oxide film and a first nitride film are sequentially formed on a silicon substrate, and then a photoresist pattern is formed to define a field region. A portion of the first nitride film, pad oxide film and silicon substrate are sequentially etched by an etching process by using the photoresist pattern as an etch mask, thereby forming a trench. The photoresist pattern is removed, and then a sacrifice oxide film is grown on the silicon substrate that is exposed at the interior of the trench. A second nitride film is deposited on the surface of the sacrifice oxide film and the first nitride film, and then a polysilicon layer is deposited on the second nitride film. The polysilicon layer is etched by an etching process, thereby forming a polysilicon spacer on the second nitride film of the inner wall of the trench. A portion of the second nitride film is etched by an etching process by using the polysilicon spacer as an etch mask, thereby forming a nitride spacer between the sacrifice oxide film and the polysilicon spacer. An isolation layer is formed by an oxidation process by oxidizing the polysilicon spacer and the exposed silicon substrate. The first nitride film, the exposed nitride spacer and the pad oxide film are sequentially removed from the silicon substrate. The first nitride film is used as an oxidation mask layer during the oxidation process to form the isolation layer. The trench is formed by an anisotropic silicon etch. The depth of the trench is from 500 to 2000 Å. The second nitride film is deposited with a thickness of from 50 to 300 Å. The nitride spacer inhibits migration of an oxidant into the silicon substrate of an active region. The nitride spacer is formed by an anisotropic nitride etch. The polysilicon layer is deposited with a thickness of from 500 to 2000 Å. The polysilicon spacer is formed by an antitropic polysilicon etch. The anisotropic polysilicon etching process is performed so that the top portion of the polysilicon spacer is formed at a position even with or lower than the surface of the silicon substrate.

BRIEF DESCRIPTION OF THE DRAWINGS

The above described purpose and other advantages of the present invention will become more apparent with the description of the preferred embodiment of the present invention with reference to the attached drawings, in which.

Similar reference characters refer to similar parts through the several views of the drawings.

DETAILED DESCRIPTION OF TEE INVENTION

FIGS. 2A to 2E illustrate the fabrication process sequence of an isolation layer in a semiconductor device according to the present invention.

Figure 1A:
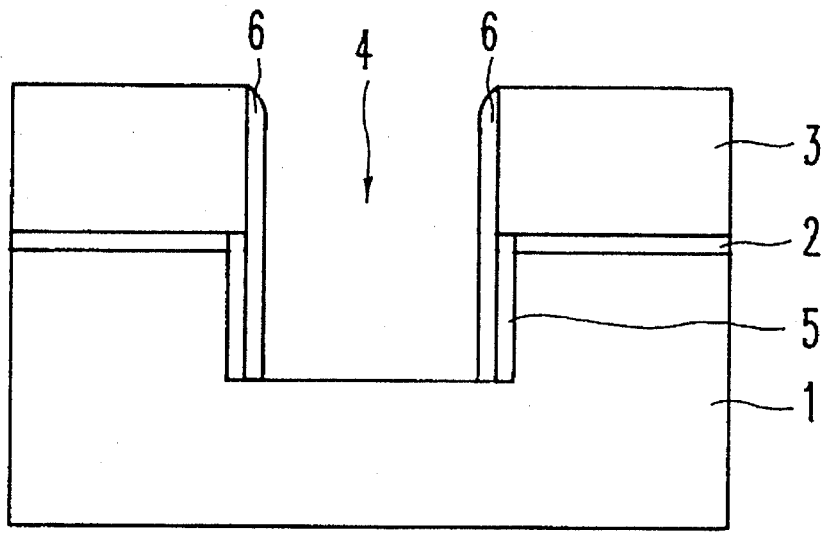
FIGS. 1A to 1C illustrate the fabrication process sequence of an isolation layer in a semiconductor device by using the conventional method.
Figure 1B:
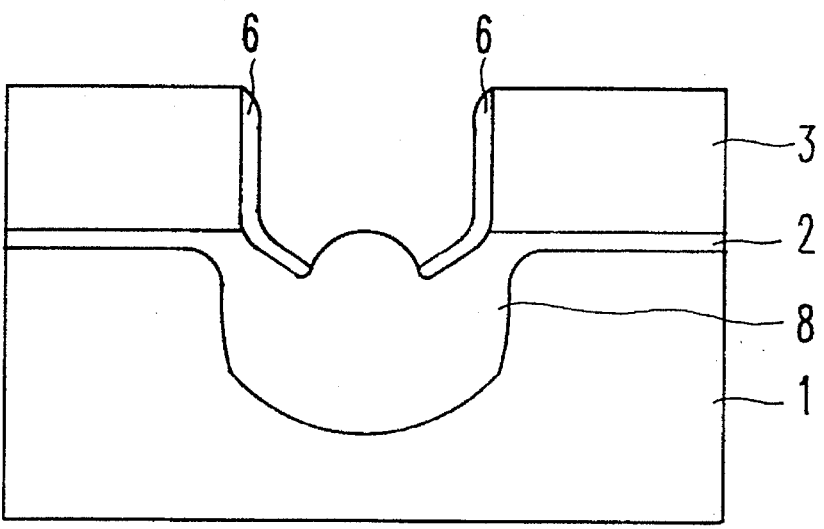
Figure 1C:
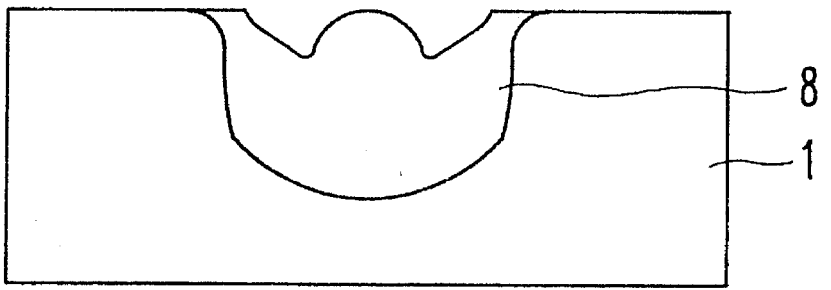
Figure 2A:
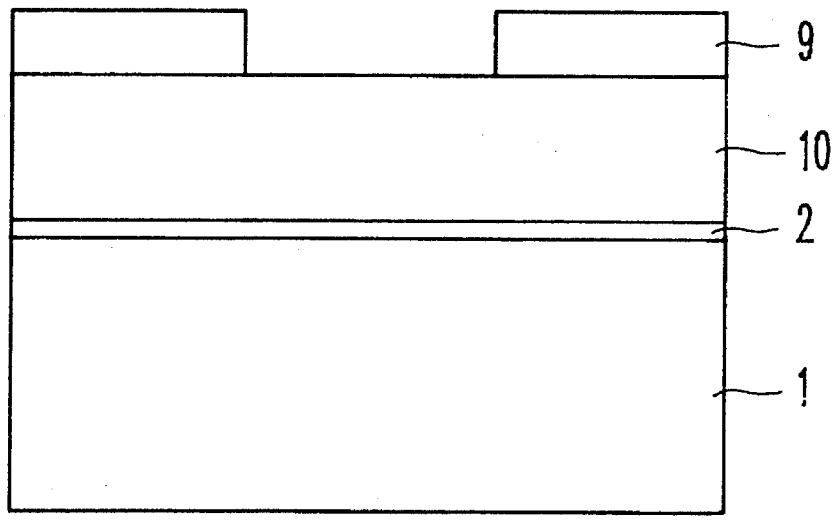
FIGS. 2A to 2E illustrate the fabrication process sequence of an isolation layer in a semiconductor device by using the present invention.

Referring to FIG. 2A, a pad oxide film 2, with a thickness of from 100 to 300 Å, is grown on a silicon substrate 1. A first nitride film 10, with a thickness of from 500 to 2000 Å, is deposited on the pad oxide film 2. A photoresist 9 is coated on the first nitride film 10. To define a field region, the photoresist 9 is patterned by means of a mask process.

When an isolation layer is formed by an oxidation process, the first nitride 10 is used as an oxidation mask layer.

Figure 2B:
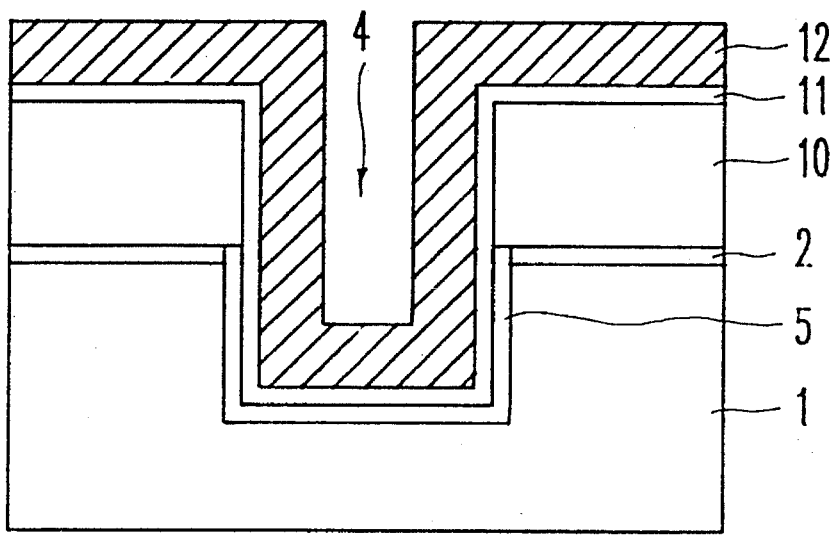

Referring to FIG. 2B, the first nitride film 10 and pad oxide film 2 are sequentially etched by using the patterned photoresist 9. Next, an exposed part of the silicon substrate 1 is etched by an anisotropic silicon etch, thereby forming a trench 4 in the silicon substrate 1. The depth of the trench 4 is from 500 to 2000 Å. After that, the patterned photoresist 9 is removed. Then, a sacrifice oxide film 5, with a thickness of from 100 to 500 Å, is grown on the silicon substrate 1 that is exposed at the interior of the trench 4. A second nitride film 11, with a thickness of from 50 to 300 Å, is deposited on the surface of the sacrifice oxide film 5 and the first nitride film 10. Then, a polysilicon layer 12, with a thickness of 500 to 2000 Å, is deposited on the second nitride film 11.

Figure 2C:
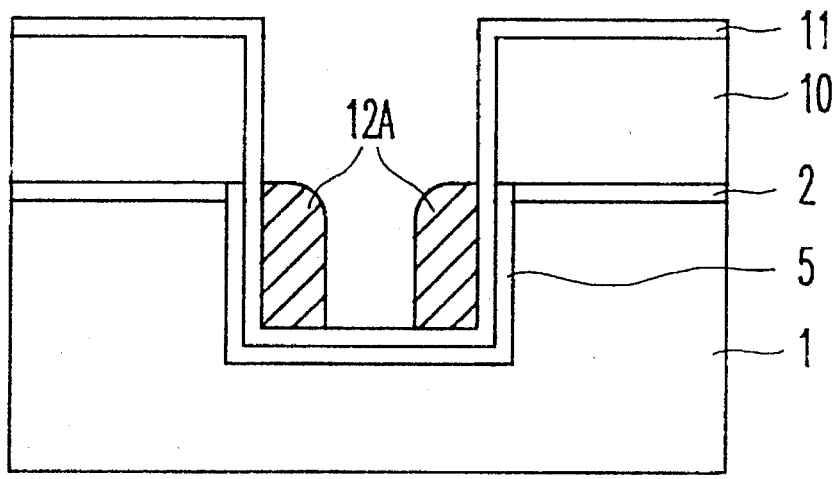

Referring to FIG. 2C, the polysilicon layer 12 is etched by an anisotropic polysilicon etch, thereby forming a polysilicon spacer 12A on the second nitride film 11 of the inner wall of the trench 4.

The anisotropic polysilicon etching process is performed so that the top portion of the polysilicon spacer 12A is even with the surface of the silicon substrate 1 or at a corner portion of the trench lower than the surface of the substrate 1.

Figure 2D:
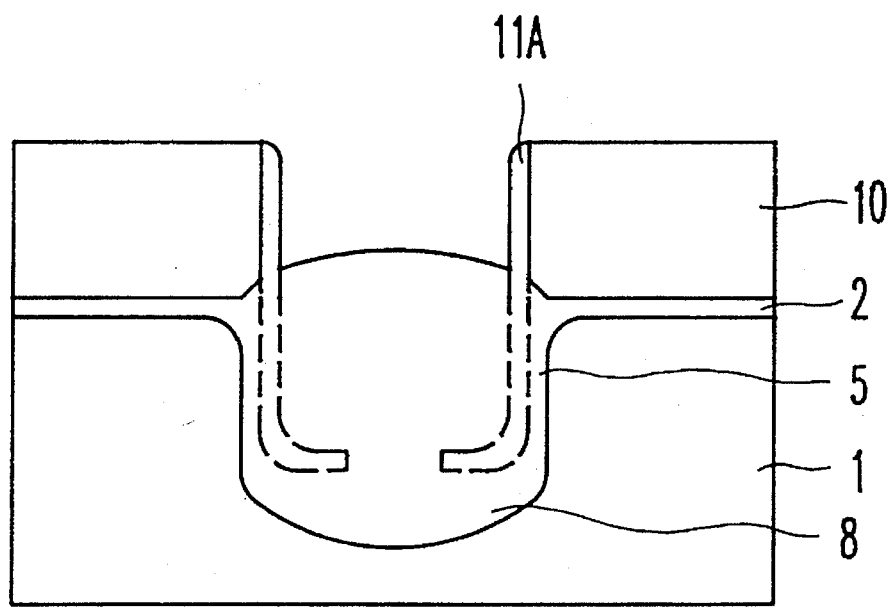

Referring to FIG. 2D, a nitride spacer 11A is formed between the sacrifice oxide film 5 and the polysilicon spacer 12A by an anisotropic nitride etch by using a polysilicon spacer 12A as an etch mask. And then, an isolation layer 8 is formed by an oxidation process.

During the oxidation process, the nitride spacer 11A prevents migration of an oxidant into the silicon substrate 1 of an active region. The isolation layer 8 is formed by oxidizing the polysilicon spacer 12A and the exposed silicon substrate 1. The nitride spacer 11A in the isolation layer 8, shown by the dotted line, provides a protective oxidation of the active region during the early oxidation process. Thereafter, the nitride spacer 11A is oxidized and incorporated into the isolation layer in the final oxidation process.

Figure 2E:
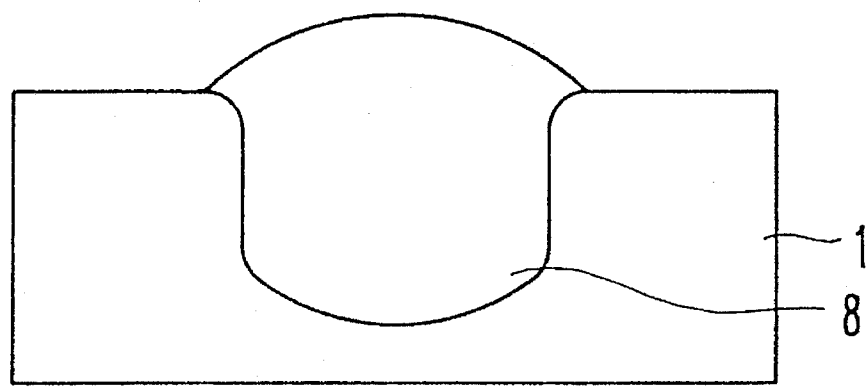

Referring to FIG. 2E, the first the exposed nitride film 10, nitride spacer 11A and the pad oxide film 2 are sequentially removed by means of a wet-etching process.

As described above, as a result of the present invention, the nitride spacer formed on the inner wall of the trench inhibits migration of the oxidant, thereby minimizing the size of the "bird's beak". Also, a top portion of the polysilicon spacer is formed at a position even with or lower than the surface of the silicon substrate. Thereafter, the polysilicon spacer is oxidized by the oxidation process, thereby decreasing the "bird's beak" as well as the stress on the silicon substrate.

Although this invention has been described in its preferred form with a certain degree of particularity, it is appreciated by those skilled in the art that the present disclosure of the preferred form has been made only as an example and that numerous changes in the details of the construction, combination and arrangement of its parts may be resorted to without departing from the spirit and scope of the invention.

What is claimed is:

1. A method for forming an isolation layer in a semiconductor device comprising the steps of:

sequentially forming a pad oxide film and a first nitride film on a silicon substrate, and then forming a photoresist pattern on said first nitride film to define a field region;

sequentially etching a portion of said first nitride film, said pad oxide film and said silicon substrate, using said photoresist pattern as an etch mask, to form a trench;

removing said photoresist pattern, and then growing a sacrifice oxide film on the silicon substrate that is exposed at the interior of said trench;

depositing a second nitride film on said sacrifice oxide film and said first nitride film, and then depositing a polysilicon layer on said second nitride film;

etching said polysilicon layer to form a polysilicon spacer on said second nitride film of the inner wall of said trench;

etching a portion of said second nitride film, using said polysilicon spacer as an etch mask, thereby forming a nitride spacer between said sacrifice oxide film and said polysilicon spacer;

forming an isolation layer by oxidizing said polysilicon spacer and said exposed silicon substrate; and sequentially removing said first nitride film, said nitride spacer and said pad oxide film from said silicon substrate.

2. The method of claim 1, wherein said first nitride film is used as an oxidation mask layer during oxidation of said polysilicon spacer and said exposed silicon substrate to form said isolation layer.

3. The method of claim 1, wherein said trench is formed by an anisotropic silicon etch.

4. The method of claim 1, wherein the depth of said trench is from 500 to 2000 Å.

5. The method of claim 1, wherein said second nitride film is deposited with a thickness of 50 to 300 Å.

6. The method of claim 1, wherein said nitride spacer is formed by an anisotropic nitride etch.

7. The method of claim 1, wherein said polysilicon layer is deposited with a thickness of 500 to 2000 Å.

8. The method of claim 1, wherein said polysilicon spacer is formed by an anisotropic polysilicon etching process.

9. The method of claim 8, wherein said anisotropic polysilicon etching process is performed so that the top portion of said polysilicon spacer is even with the surface of said silicon substrate.

10. The method of claim 8, wherein said anisotropic polysilicon etching process is performed so that the top portion of said polysilicon spacer is lower than the surface of said silicon substrate.

* * * * *